United States Patent

Morrison

[11] 4,392,718
[45] Jul. 12, 1983

[54] RESISTIVE ELECTRODE LCD AND VOLTAGE SUPPLY MEANS

[75] Inventor: John M. Morrison, Edinburgh, Scotland

[73] Assignee: Ferranti Limited (now Ferranti plc), Cheadle, England

[21] Appl. No.: 221,499

[22] Filed: Dec. 30, 1980

[30] Foreign Application Priority Data

Jan. 12, 1980 [GB] United Kingdom ............... 8001093

[51] Int. Cl.³ .................................... G02F 1/13
[52] U.S. Cl. ........................ 350/336; 350/331 R
[58] Field of Search .......... 350/336, 330, 332, 331 R, 350/333, 334; 340/765, 784

[56] References Cited

U.S. PATENT DOCUMENTS

| | | | |
|---|---|---|---|
| 3,675,988 | 7/1972 | Soref | 350/336 |
| 3,868,674 | 2/1975 | Lorteije | 340/765 X |
| 3,975,085 | 8/1976 | Yamada et al. | 350/336 |

FOREIGN PATENT DOCUMENTS 1523162  1/1976  United Kingdom ............... 350/332

Primary Examiner—John K. Corbin
Assistant Examiner—David Lewis
Attorney, Agent, or Firm—Kerkam, Stowell, Kondracki & Clarke

[57] ABSTRACT

A liquid display device comprises two spaced electrodes each having a resistance characteristic such that a potential gradient may be developed across the electrode. A liquid crystal material is located between the two electrodes. Voltage supply means are provided which apply an alternating potential across each electrode, such that the two potentials are of the same frequency, and, preferably, in quadrature with one another.

6 Claims, 5 Drawing Figures

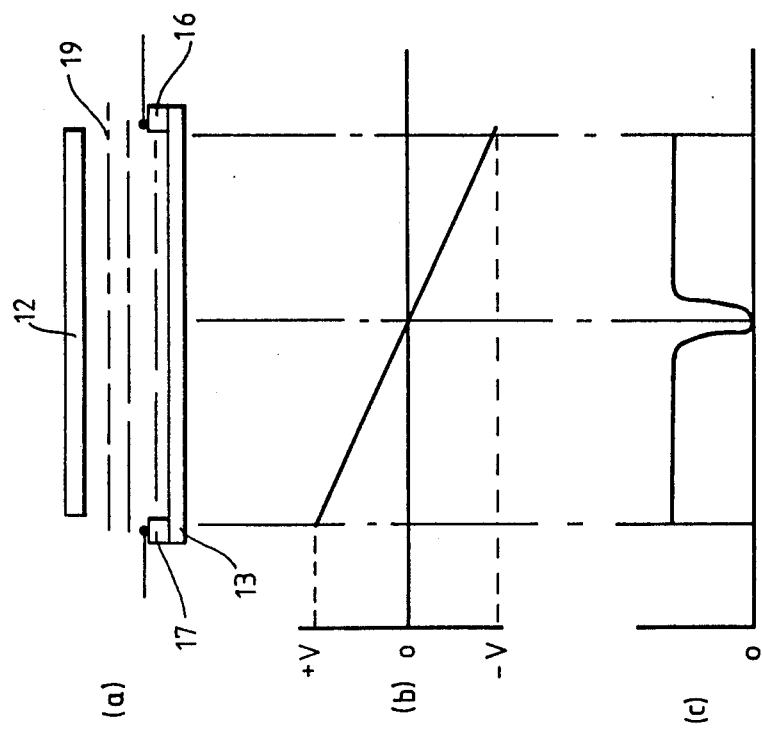
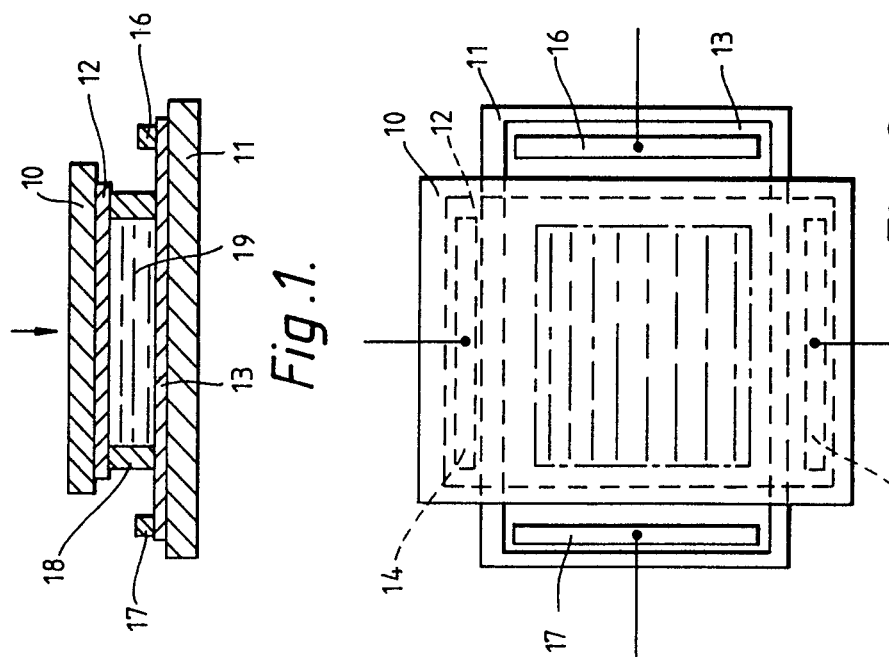
Fig.1.
Fig.2.
Fig.3.

RESISTIVE ELECTRODE LCD AND VOLTAGE SUPPLY MEANS

This invention relates to display apparatus, and in particular to such apparatus using liquid crystal material to produce the display.

Liquid crystal display devices are well-known in several forms, the most common being the seven-bar display used to produce a digital representation. These require the use of suitably-shaped electrodes, and will only display the characters which may be represented by the seven-bar arrangement. Other liquid crystal displays use shaped electrodes to provide an analogue representation, for example representing the rotating hands of a clock or watch. In both cases, however, it is not possible to produce gradual change of the display; change can only be represented by the abrupt movement from one display position to another.

The liquid crystal material most commonly used is one which is normally transparent to incident light, but becomes opaque or reflective when an electric field is applied across it. A thin layer of liquid crystal, say 10 m$\mu$ thick, is sandwiched between a pair of electrodes, one of which is transparent. An electric field may then be applied between the electrodes to change the appearance of the liquid crystal material.

It is also known to produce bar-type displays in which a bar may be moved gradually by varying an applied electrical potential, but the applications of such a display are limited.

It is an object of the present invention to provide a liquid crystal display in which a small spot may be displayed and moved at will over a display area.

According to the present invention there is provided a display device which includes a pair of spaced electrodes each having a resistance characteristic such that a potential gradient may be developed across the electrode, a pair of terminals on each electrode located such that the potential gradients developed across the two electrodes extend at an angle to one another, a liquid crystal material located between the two electrodes and being of a type which becomes opaque when an electric field is applied across it, and voltage supply means operable to apply an alternating potential across each pair of terminals, such that the two potentials are of the same frequency and are out of phase with one another by an angle which determines the form of the display.

The invention will now be described with reference to the accompanying drawings, in which:

FIG. 1 is a schematic view of a display device,

FIG. 2 is a plan view of the device of FIG. 1;

FIG. 3 illustrates the operation of the device of FIG. 2;

Figure 4:
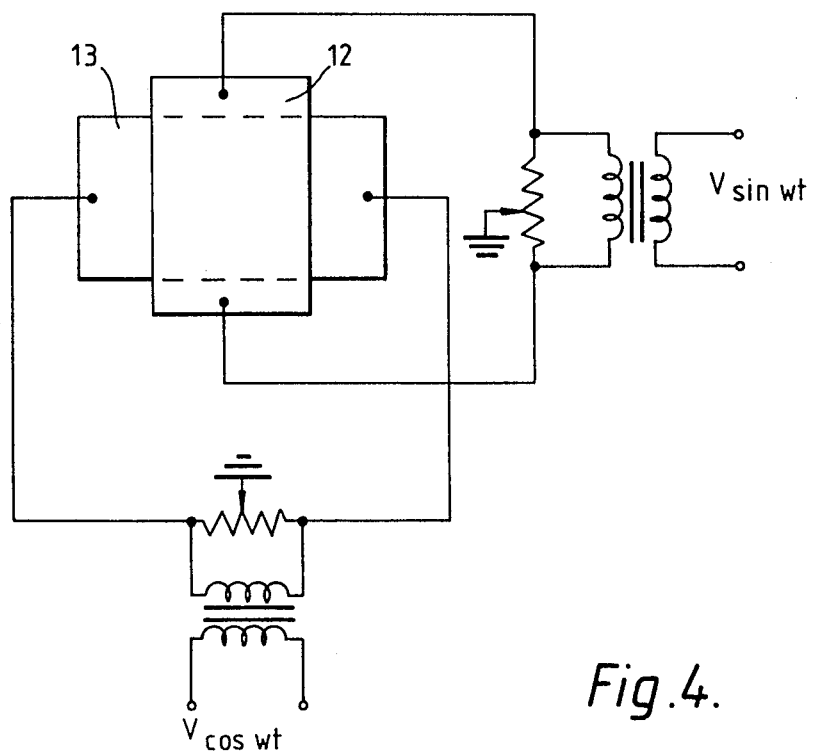
FIG. 4 is a schematic diagram showing one form of voltage supply means.

Referring now to FIGS. 1 and 2, a display device according to the invention is built up on two plates 10 and 11 of electrically insulating material. If the device is to be viewed in the direction of the arrow in FIG. 1 then at least the plate 10 will be transparent. On the inwardly-facing surfaces of each of the plates is formed an electrode in the form of a thin deposited or evaporated layer of a suitable metal. Each of these layers 12 and 13 is of high resistivity material such that a potential gradient may be developed across the electrode. At least the electrode 12 must be transparent. As shown in FIG. 2, a terminal strip is formed across each end of the electrode 12, these strips 14 and 15 each being of low resistivity and having an electrical connection formed on them. In a similar way, terminal strips 16 and 17 are formed across the ends of the other electrode 13 to provide electrical connections. The strips 14 and 15 are substantially perpendicular to the strips 16 and 17, in the same way that the two electrodes 12 and 13 are perpendicular to one another.

The space between the electrodes 12 and 13 is enclosed by a barrier 18 of a suitable material, and the volume enclosed by this barrier 18 and the two electrodes 12 and 13 is filled with a suitable liquid crystal material 19. The general type of liquid crystal material has already been specified.

Display devices of the type described above are known, and are used to form the direct-current or alternating-current energised displays already described.

The operation of the display device will now be described with reference to FIG. 3. FIG. 3(a) shows the device in schematic form, with only the electrodes 12 and 13, terminal strips 16 and 17, and the liquid crystal material 19 shown.

If a voltage of 2 V is applied between strips 16 and 17, then the potential gradient will be as shown in FIG. 3(b), assuming that the voltage $+V$ is applied to terminal strip 17 and the voltage $-V$ to terminal strip 16. Hence a region across the electrode 13, mid-way between the two terminal strips, will be at zero voltage. If now both terminal strips of electrode 12 are connected to zero voltage, then the region across the electrode 13 will define a region of liquid crystal material across which no electric field exists. The remainder of the liquid crystal material will be subject to an electric field of predetermined magnitude, though this will vary with position. Since the liquid crystal material is one which becomes opaque when an electric field is applied across it, the display will have the appearance of an opaque bar in an otherwise translucent area, FIG. 3(c) illustrates the change of optical characteristics across the display area. There is not, of course, an abrupt transition between the translucent and opaque states. Any reflection which exists when there is no electric field is related only to the background behind the display.

The effect described above is obtained regardless of whether the applied voltage across electrode 13 is alternating or direct. However, the effect produced by the application of a similar voltage across the other electrode 12 may vary. The application of a similar voltage, either direct or alternating and in-phase, will result in the bar being repositioned so as to be diagonally across the display area, assuming this to be square. The essential feature of the invention, however, is that the two applied voltages are not in phase with one another. FIG. 4 illustrates, in schematic form, one suitable arrangement. Across the electrode 12 is connected the secondary winding of a transformer having a voltage Vsin$\omega$t applied to its primary winding. Also across the secondary winding is a potentiometer with its tapping point earthed. Hence by adjustment of the tapping point the voltage distribution with respect to earth may be varied whilst keeping the voltage across the electrodes at a constant value.

The other electrode 13 is connected in a similar manner to a second transformer having a voltage Vcos$\omega$t applied to it. As before, a potentiometer with an earthed tapping point is connected across the transformer secondary winding. With the electrodes at right angles and the voltages in quadrature a square spot may be caused to move over the display area. The size of the spot depends, amongst other things, on the values of the applied voltages. Larger voltages will result in a smaller spot size.

A square spot may be produced by arranging the electrodes at other angles than 90° to one another, with appropriate adjustment of the phase difference between the two voltages. Similarly, with any particular electrode configuration the shape of the spot may be changed by varying the phase difference between the two voltages.

Figure 5:
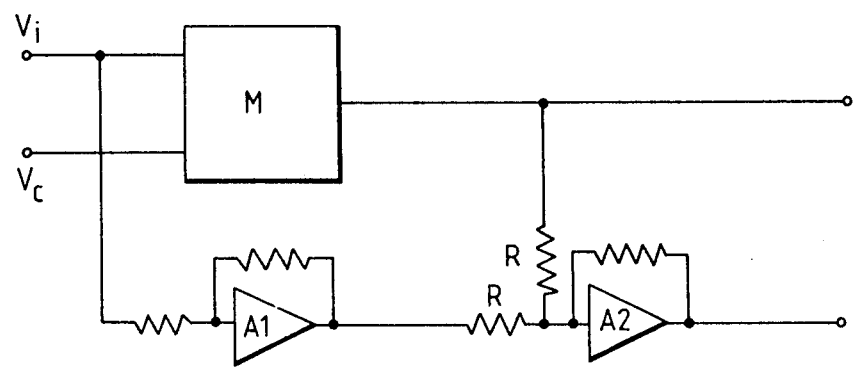
FIG. 5 is a block diagram of an alternative form of voltage supply means.

Purely be way of example, FIG. 5 illustrates a simple circuit for producing the desired movement of the spot about one axis only. The circuit comprises a multiplier M to which is applied the voltage Vsinwt, designated Vi, and a control voltage Vc. The output Vo from the multiplier is applied to one terminal of one of the two electrodes. The sinusoidal voltage Vi is also connected by way of an inverting amplifier A1, with gain G, to one input of a summing amplifier A2. The other input of the summing amplifier A2 is connected to the output Vo of the multiplier M. The two summing resistors of amplifier A2 are of equal value. The output of the summing amplifier is connected to the other terminal of the electrode.

In operation, the output voltage Vo of the multiplier, which is connected to one terminal, is the product of the input voltage Vi and the control voltage Vc. The output of the inverting amplifier A1 is −G.Vi, and this is added to the voltage Vc.Vi from the multiplier. Hence the voltage applied to the other terminal of the electrode is Vi(Vc−G). Variation of the control voltage Vc results in the voltage applied to one terminal rising whilst the voltage applied to the other terminal falls by the same amount. The voltage between the two terminals remains constant at GVi.

By way of example, consider the case where gain of the inverting amplifier A1 is 10, the RMS value of the voltage Vi is 10 volts, and the control voltage Vc is variable between 0 volts and 10 volts. If Vc and Vi are both 10 volts, then the output of the multiplier is 100 volts with respect to earth, and this is applied to one terminal of the electrode. The output of the inverting amplifier is also 100 volts, and hence the output of the summing amplifier A2 is zero. Hence the other terminal of the electrode is at earth potential.

Consider now the case where the control voltage Vc is 5 volts. The multiplier output Vo is then 50 volts, whilst the output of amplifier A1 is −100 volts. The summing amplifier output is thus −50 volts, so that equal and opposite voltages are applied to the two terminals. The voltage across the electrode is, however, still 100 volts. It will be seen that the variation of the control voltage over its full range varies the voltage distribution across the electrode, whilst maintaining a constant voltage across it.

A similar circuit may be used for the other electrode, with the voltage Vi of the form Vcoswt. Hence the variation of the two control voltages will enable the spot to be moved to any position of the display area.

In order to avoid flickering of the display, the frequency of the two applied voltages should be preferably greater than 50 Hz. Frequencies in the range 500–2000 Hz would be suitable. The time constant of the liquid crystal material tends to be temperature-dependent, but at normal operating temperatures tends to be in the tens of milliseconds range.

Other forms of supply means may be used which satisfy the criteria set out above. The energising voltages may be other than sinusoidal. For example, square waveforms may be used.

What I claim is:

1. A display device which includes a pair of spaced electrodes each having a resistance characteristic such that a potential gradient may be developed across the electrode, a pair of terminals on each electrode located such that the potential gradients developed across the two electrodes extend at an angle to one another, a liquid crystal material located between the two electrodes and being of a type which becomes opaque when an electric field is applied across it, voltage supply means operable to apply an alternating potential across each pair of terminals, such that the two potentials are of the same frequency and are out of phase with one another by an angle which determines the form of the display and in which the voltage supply means are arranged to provide, across each electrode, a constant voltage and include means for varying the potential of each terminal with respect to a reference potential.

2. A display device as claimed in claim 1 in which the electrodes are arranged such that their potential gradients are perpendicular to one another, and in which the alternating potentials applied across the two pairs of terminals are in quadrature with one another.

3. A display device as claimed in claim 2 in which at least one of the electrodes is transparent and is mounted on a transparent substrate.

4. A display device as claimed in claim 1 in which the voltage supply includes, for each electrode, multiplying means to which are applied a constant alternating input voltage and a variable control voltage and having its output connected to one terminal of the electrode, a constant gain amplifier to which is applied the said input voltage, and a summing amplifier having as its inputs the outputs of the multiplier and of the constant gain amplifier and having its output connected to the other terminal of the electrode.

5. A display device as claimed in claim 4 in which the control voltage is variable over the range from zero to a value numerically equal to the gain of the constant gain amplifier.

6. A display device as claimed in claim 1 in which the alternating potentials are of sinusoidal waveform.

* * * * *